(12) United States Patent
Hsu et al.

(10) Patent No.: US 6,566,191 B2
(45) Date of Patent: May 20, 2003

(54) FORMING ELECTRONIC STRUCTURES HAVING DUAL DIELECTRIC THICKNESSES AND THE STRUCTURE SO FORMED

(75) Inventors: Louis L. Hsu, Fishkill, NY (US); Jack A. Mandelman, Stormville, NY (US); Carl J. Radens, LaGrangeville, NY (US); Richard A. Strub, Essex Junction, VT (US); William R. Tonti, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/731,148

(22) Filed: Dec. 5, 2000

(65) Prior Publication Data

US 2002/0066916 A1 Jun. 6, 2002

(51) Int. Cl.[7] .......................................... H01L 21/8242
(52) U.S. Cl. .................... 438/243; 438/244; 438/386
(58) Field of Search ................. 438/243, 244, 438/246, 386, 387, 389; 257/68, 301

(56) References Cited

U.S. PATENT DOCUMENTS

| | | | |
|---|---|---|---|
| 4,327,476 A | 5/1982 | Iwai et al. ................... | 438/386 |
| 4,641,279 A | 2/1987 | Kimura et al. .............. | 365/149 |
| 4,651,306 A | 3/1987 | Yanagisawa ........... | 365/189.07 |
| 4,912,535 A | 3/1990 | Okumura .................... | 257/301 |
| 4,931,849 A | 6/1990 | Tajima ....................... | 257/296 |
| 5,275,974 A | 1/1994 | Ellul et al. | |
| 5,708,559 A | 1/1998 | Brabazon et al. | |
| 5,776,817 A | 7/1998 | Liang ......................... | 438/427 |
| 5,818,110 A | 10/1998 | Cronin | |
| 6,214,686 B1 * | 4/2001 | Divakaruni et al. ......... | 438/386 |
| 6,297,103 B1 * | 10/2001 | Ahn et al. ................... | 438/239 |

FOREIGN PATENT DOCUMENTS

| | | |
|---|---|---|
| JP | 63-199456 A | 8/1988 |
| JP | 1-119057 A | 5/1989 |
| JP | 6-5809 A | 1/1994 |

OTHER PUBLICATIONS

"Method to Make Wide Lines Thicker Without an Added Photo Mask", Cronin et al. IBM TDB, Jun. 1990, vol. 33 No. 1A, pp. 460–461.
"Chemical Vapor Deposition of Tungsten to Fill Oversize Vias", J. E. Cronin, IBM TDB, Dec. 1986, vol. 29, No. 7, pp. 3254–3255.
"Variable Depth Contact Hole Preparation Utilizing a Nucleation Layer and Selective Chemical Vapor Deposition for Stud Formation", Cronin et al. IBM TDB, Jun. 1986, vol. 29, No. 1, pp. 310 311.
"Optical Thickness Monitor for Continuous Vapor Deposited Film", Cronin et al., IBM TDB, Aug. 1986, vol. 29, No. 3, pp. 1306–1307.
Extending Trench Dram Technology To 0.15 μm Groundrule And Beyond, Rupp et al., IEDM 99, pp. 33–36.
A Fully Planarized 0.25 μm CMOS Technology For 256Mbit DRAM and Beyond, Bronner et al., 1995 Symposium on VLSI Technology Digest of Technical Papers, pp. 15–16.
A 0.6μm[2] 256Mb Trench DRAM Cell With Self–Aligned BuriEd STrap (BEST), Nesbit et al., IEDM 93, pp. 627–630.

* cited by examiner

*Primary Examiner*—Wael Fahmy
*Assistant Examiner*—Hoai Pham
(74) *Attorney, Agent, or Firm*—Schmeiser, Olsen & Watts; Richard A. Henkler

(57) ABSTRACT

A structure including a first device and a second device, wherein the second device has a dielectric thickness greater than the dielectric thickness of the first device, and the method of so forming the structure.

9 Claims, 19 Drawing Sheets

FORMING ELECTRONIC STRUCTURES HAVING DUAL DIELECTRIC THICKNESSES AND THE STRUCTURE SO FORMED

BACKGROUND OF THE INVENTION

1. Technical Field

The present invention relates generally to semiconductor devices, and more particularly, to a method of forming semiconductor devices having dual dielectric thicknesses, and the devices so formed.

2. Related Art

Currently, semiconductor devices are being constructed that are capable of performing several different functions, each potentially operating at different voltage levels. As a result, both thick and thin oxide dielectric layers are required to accommodate the passage of high and low voltages, respectively. For instance, thin oxide dielectric layers, capable if withstanding low voltages, are necessary to maintain high speed operation of the device, and perform such functions as memory storage, etc. However, the thin dielectric material is incapable of safely accommodating the higher voltages, as required to perform such functions as capacitance decoupling, low to high and high to low signal interfacing, electrostatic discharge protection, etc.

Accordingly, there is a need in the industry to efficiently construct a semiconductor device capable of safely accommodating both high and low voltages, while maintaining a small overall device size.

SUMMARY OF THE INVENTION

The first general aspect of the present invention provides electronic structure comprising: a first device and a second device formed within a substrate, wherein the first device includes a first dielectric and the second device includes a second dielectric, and wherein the second dielectric has a greater thickness than the first dielectric.

The second general aspect of the present invention provides a method of forming an electronic structure, comprising: providing a substrate; forming a first device having a first dielectric thickness; and forming a second device having a second dielectric thickness, wherein the second dielectric thickness is greater than the first dielectric thickness.

The foregoing and other features of the invention will be apparent from the following more particular description of the embodiments of the invention.

BRIEF DESCRIPTION OF THE DRAWINGS

The embodiments of this invention will be described in detail, with reference to the following figures, wherein like designations denote like elements, and wherein.

DESCRIPTION OF THE PREFERRED EMBODIMENTS

Although certain embodiments of the present invention will be shown and described in detail, it should be understood that various changes and modifications may be made without departing from the scope of the appended claims. The scope of the present invention will in no way be limited to the number of constituting components, the materials thereof, the shapes thereof, the relative arrangement thereof, etc. Although the drawings are intended to illustrate the present invention, the drawings are not necessarily drawn to scale.

Figure 1:
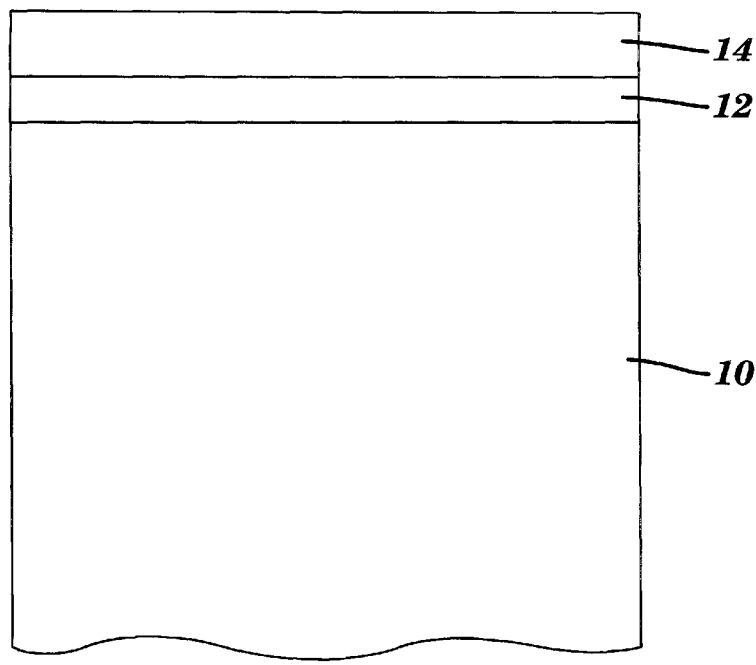
FIG. 1 depicts a cross-sectional view of a wafer having a pad and a mask thereon in accordance with a first embodiment of the present invention.

Referring to the drawings, FIG. 1 shows a cross-sectional view of a substrate 10 in accordance with a first embodiment. The substrate 10 may be a silicon wafer of a dynamic random access memory (DRAM), an embedded dynamic random access memory (EDRAM) device, or other similar device. The substrate 10 includes a pad 12 formed thereon. The pad 12 comprises silicon nitride, or other similarly used material. The pad 12, deposited using low pressure chemical vapor deposition (LPCVD), or other similarly used techniques, has a thickness within the range of approximately 50–300 nm, e.g., 100 nm. The pad 12 functions as a polish stop layer during a subsequent process step (described infra).

The substrate 10 further includes a mask 14 over the pad 12. The mask 14 may be a hard mask comprising silicon dioxide or other similar material. The mask 14 is formed having a thickness in the range of approximately 100–2000 nm, e.g. 1000 nm.

Figure 2:
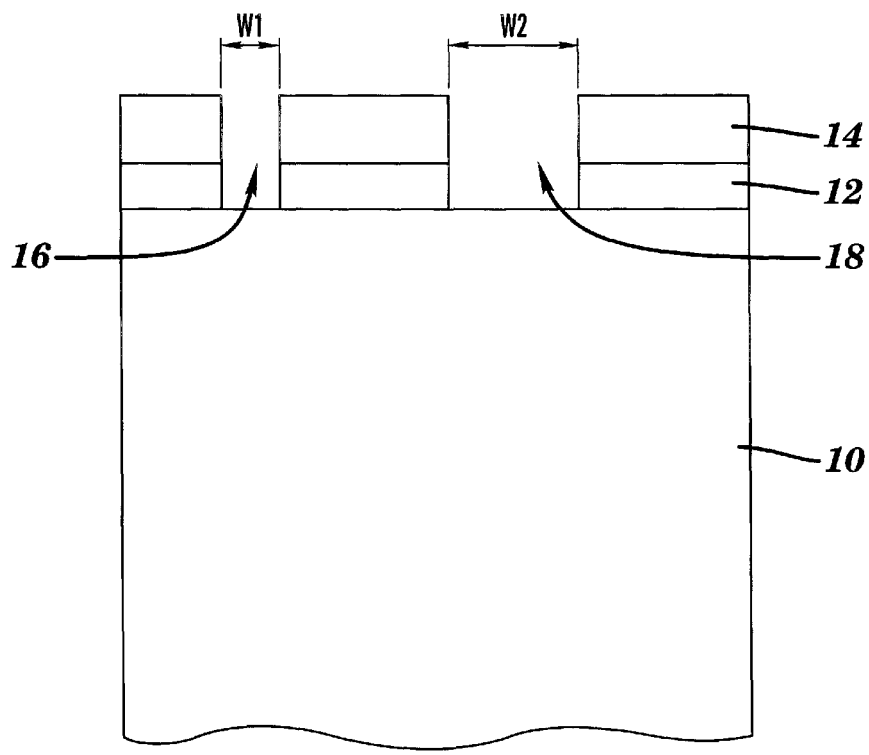
FIG. 2 depicts the wafer of FIG. 1 following patterning of the mask and pad.

A plurality of trenches are then patterned within the mask 14 and pad 12 using conventional photolithographic techniques. In the present example, only two trench patterns 16 and 18 are shown in FIG. 2 for ease of illustration. The trench patterns 16, 18, having different widths W1 and W2, respectively, are patterned on the surface of the substrate 10. For example, the first trench pattern 16 patterns an array trench capacitor, while the second trench pattern 18 patterns a support trench capacitor.

Figure 3:
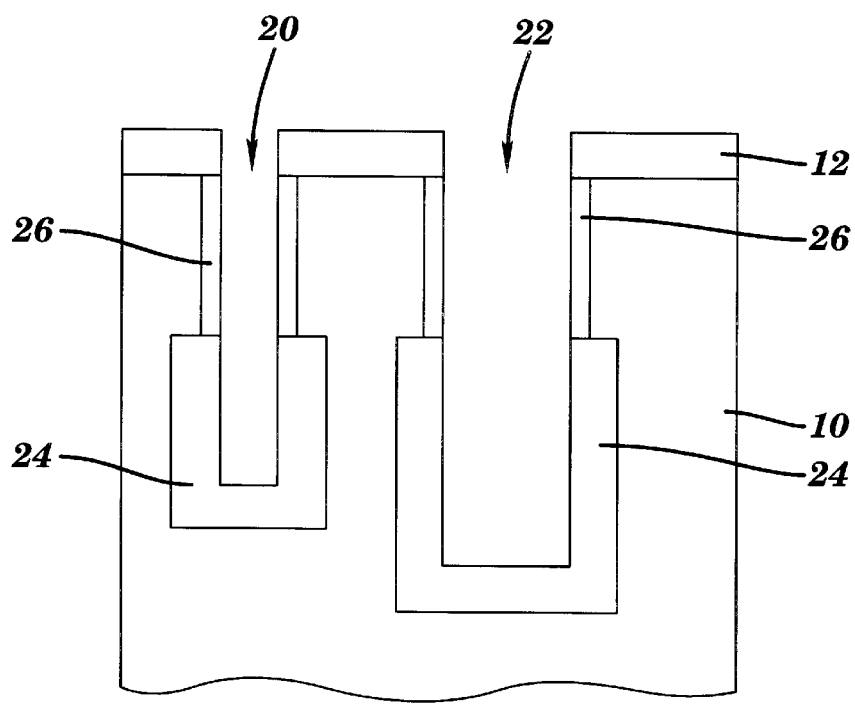
FIG. 3 depicts the wafer of FIG. 2 following the formation of a collar and buried plate.

As shown in FIG. 3, the trench patterns 16, 18 are then used to form trenches 20, 22 within the substrate 10. In particular, the trenches 20, 22 are formed using a conventional reactive ion etch (RIE) process, or other similar process. The trenches 20, 22 are etched to a depth in the range of approximately 1–10 microns, e.g., 6–7 microns. As illustrated, the support trench 22, having a greater width W2 opening than the width W1 opening of the array trench 20, etches to a greater depth than the array trench 20. The support trench 22 is formed having a greater width W2 opening, and therefore will etch to a greater depth, than that of the array trench 20, for purposes of manufacture, and will be described in more detail below.

Thereafter, a buried plate 24 and collar 26 are formed within each of the trenches 20, 22 using conventional techniques well known in the art (shown in FIG. 3). For example, as described in publication by T. Rupp et al., (IEDM Tech. Dig., p.33, 1999), which is herein incorporated by reference, the buried plate 24 and collar 26 may be formed by first depositing a silicon nitride barrier layer or film within the bottom of the trenches 20, 22. The trenches 20, 22 are filled with photoresist, which is then etched to a depth equal to that of the collar 26. The silicon nitride within the upper region of each trench is etched. The photoresist is removed from the remaining portion of each trench 20, 22. The upper region of each trench 20, 22 is then thermally oxidized, wherein the silicon nitride remaining within the lower regions of the trenches 20, 22 serve as a mask. The SiN from the lower region of each trench 20, 22 are then removed, and thermal dopant diffusion is used to form a buried plate within each trench 20, 22. It should be noted that other conventionally used techniques may also be used.

Figure 4:
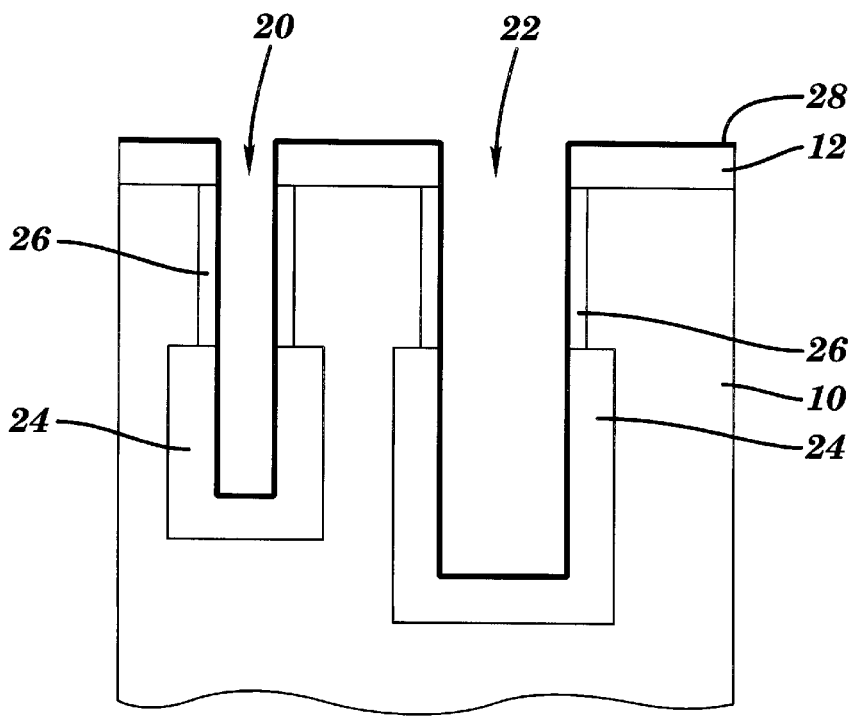
FIG. 4 depicts the wafer of FIG. 3 following the deposition of a first node dielectric.

As illustrated in FIG. 4, a thin node dielectric material 28 is then formed over the surface of the substrate 10, covering the pad 12 and the trenches 20, 22. The thin node dielectric material 28 comprises silicon nitride, or other similar materials, such as, a combination of silicon dioxide and nitride, re-oxidized silicon nitride, tantalum oxide, titanium oxides, etc. The thin node dielectric material 28 is deposited using LPCVD techniques, and has a thickness in the range of approximately 2–10 nm, e.g., 3 nm. Alternatively, the thin node dielectric material 28 may be formed using thermal oxidation of silicon or other reactive techniques, (e.g., nitridation of silicon).

Figure 5:
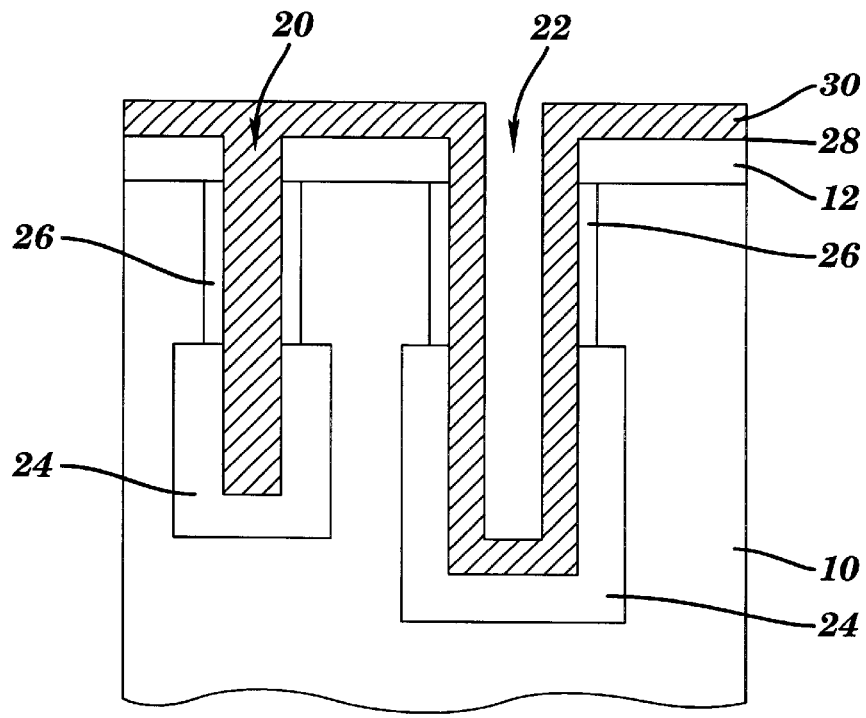
FIG. 5 depicts the wafer of FIG. 4 following the deposition of a conductive material.

A conductive material 30, such as amorphous silicon, polysilicon, or other similar material, such as TiN, W, or other refractory materials, is conformally deposited on the surface of the substrate 10, as illustrated in FIG. 5. The conductive material 30 is deposited using conventional LPCVD, or other similar techniques. The conductive material 30 is deposited such that the material 30 substantially fills the array trench 20, but only partially fills the support trench 22 and conformally covers the walls of the support trench 22. In particular, the conductive material 30 is deposited having a thickness more than twice the width W1 of the array trench 20, and less than twice the width W2 of the support trench 22.

Figure 6:
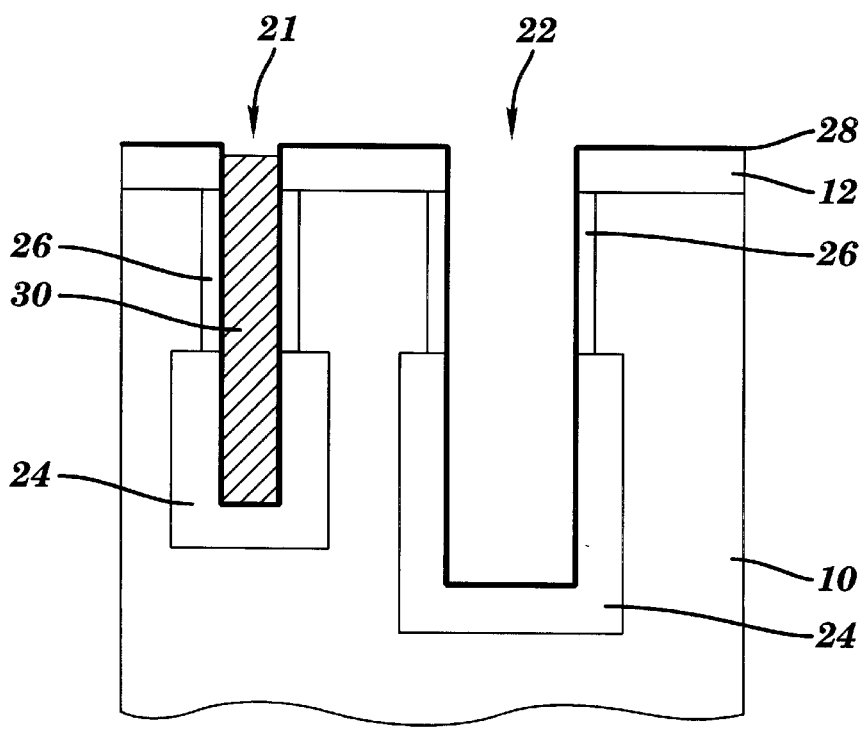
FIG. 6 depicts the wafer of FIG. 5 following a partial removal of the conductive material.

The excess conductive material 30 on the surface of the substrate 10 and within the support trench 22 is removed using an isotropic partial etch, such as a Fl or Cl containing chemical dry etch, or other similar process. The conductive material 30 within the array trench 20, however, is not removed, and in fact forms a completed array capacitor 21, as illustrated in FIG. 6.

Figure 7:
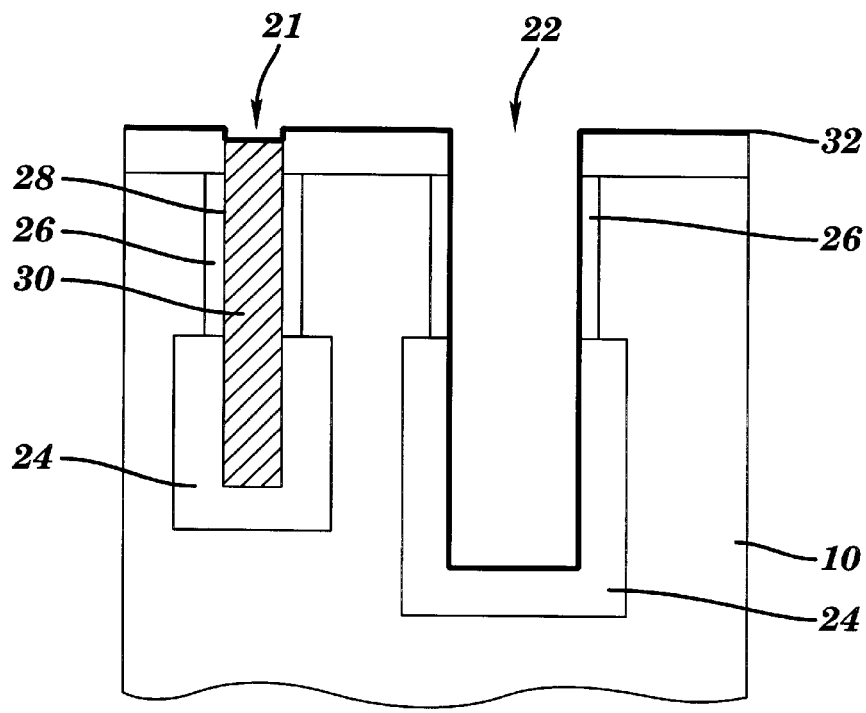
FIG. 7 depicts the wafer of FIG. 6 following the deposition of a second node dielectric.

Thereafter, a thick node dielectric material 32 is formed over the surface of the substrate covering the thin node dielectric material 28 on the surface of the pad 12, as well as within the support trench 22 (FIG. 7). In the alternative, the thin node dielectric material 28 covering the surface of the pad 12 and within the support trench 22 may be removed using a conventional etch process, such as hot phosphoric acid, or a solution containing Hf and glycerol, prior to the formation of the thick node dielectric material 32.

The thick node dielectric material 32 comprises silicon nitride, deposited or thermally grown silicon dioxide, or other similar materials, such as, a combination of silicon dioxide and nitride, re-oxidized silicon nitride, tantalum oxide, titanium oxides, etc. For the case of deposited thick node dielectric material 32, LPCVD techniques may be used, with a thickness in the range of approximately 2–10 nm, e.g., 5 nm.

Figure 8:
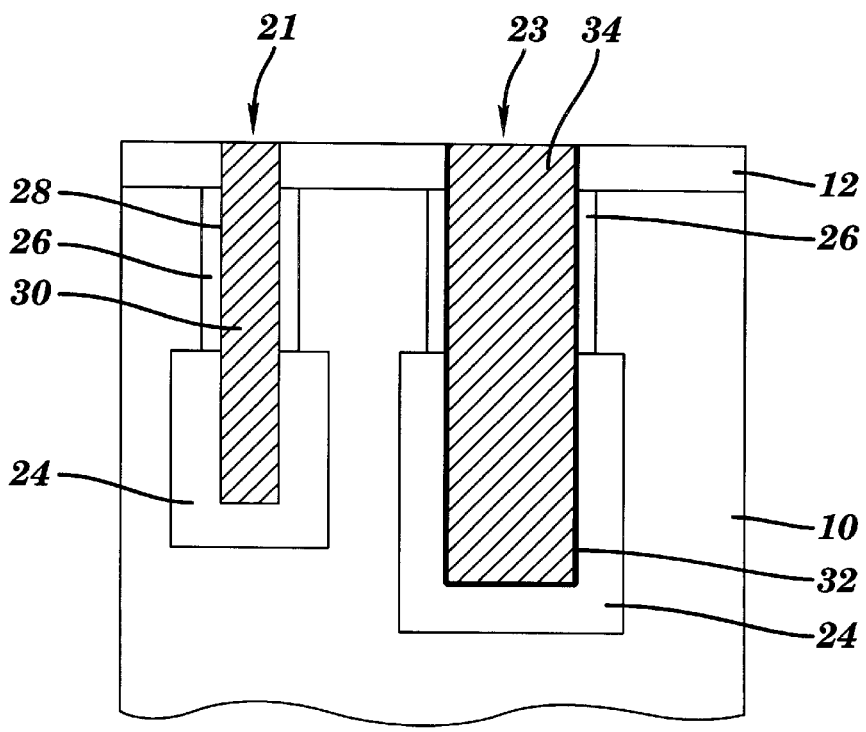
FIG. 8 depicts the wafer of FIG. 7 following a planarization process.

A conductive material 34, such as amorphous silicon, polysilicon, or other similar material, is then deposited over the surface of the substrate 10 to substantially fill the support trench 22. The conductive material 34 is deposited using conventional LPCVD, or other similar techniques. Thereafter, the excess conductive material 34 on the surface of the substrate 10 is removed using planarization techniques, such as a chemical mechanical planarization (CMP) technique (FIG. 8). The planarization also removes the thick node dielectric material 32 from the surface of the substrate 10, (as well as the thin node dielectric material 28 if not already removed prior to the deposition of the thick node dielectric material 32), and a portion of the pad 12, wherein the pad 12 serves as a polish stop layer. This forms the completed support capacitor 23.

The thick dielectric material 32 within the support capacitor 23 results in a lower capacitance per unit area within the support capacitor 23 than within the array capacitor 21, which has thin dielectric material 28. Furthermore, the support capacitor 23 has a higher "breakdown voltage" than the array capacitor 21. In other words, the increased dielectric thickness within the support capacitor 23 allows for exposure to higher voltages than those which the array capacitor 21 can safely withstand, without producing failure. Therefore, the support capacitor 23 may be used for decoupling, or other similar functions, that the array capacitor 21 would not be capable of reliably performing. Moreover, the present invention provides support capacitors 23 capable of withstanding higher voltages than the array capacitors 21 (due to the increased dielectric thickness of the support capacitors 23), with only 20–50%, typically a 30%, increase in capacitor area, rather than the 400% increase required using conventional solutions, in which the capacitors are aligned in series.

Although the thick node dielectric 32 decreases the capacitance of the support capacitor 23, this reduction is off-set by the increased surface area within the support capacitor 23. In particular, the increased width W2 of the support trenches 22 produces a deeper etched trench 22 due to the reduction in aspect ratio of the support trench 23. This results in an increased surface area within the support capacitor 23, which increases the overall capacitance of the support capacitor 23, thereby off-setting the reduction in capacitance per unit area, due to the increased dielectric thickness, and gaining back the lost capacitance. This is desirable because it produces a device having more sustainable voltage levels.

Additionally, by forming the support capacitor 23 having a greater trench width W2 than that of the array capacitor 21, a "maskless" process may be used during the manufacture of the device. In other words, rather than using conventional masking techniques to form the different trench capacitors 21, 23, the differences in trench 20, 22 size are used to differentiate between the array capacitor 21 and the support capacitor 23 during formation. Particularly, because the support trench 22 is larger than the array trench 20, the support trench 22 is under-filled, or only partially filled, during deposition of the conductive material 30 that fills the array trench 20. As a result, the conductive material within the support trench 22 may be easily removed without removing the conductive material within the array trench 20 that forms the completed array capacitor 21.

Figure 9:
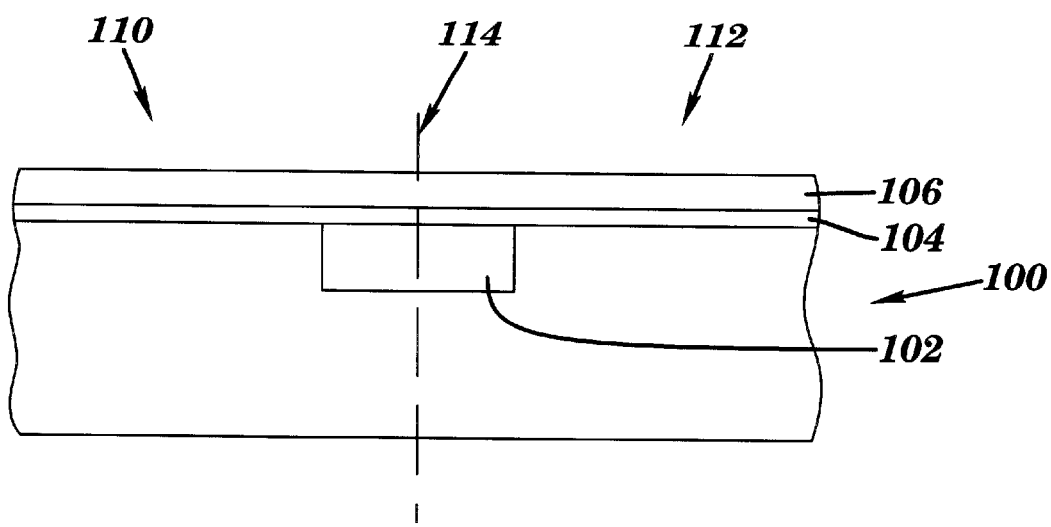
FIG. 9 depicts a transistor having a barrier layer and a conductive layer in accordance with a second embodiment of the present invention.

In accordance with a second embodiment of the present invention, FIG. 9 shows a cross-sectional view of a substrate 100, such as a single crystal silicon wafer of a MOSFET device. The substrate 100, in this example, a transistor, includes a shallow trench isolation (STI) 102 formed therein using processes known in the art. A barrier layer 104 is deposited over the surface of the substrate 100 using LPCVD, or other similar processes. The barrier layer 104 comprises a dielectric, such a deposited silicon nitride, a grown nitridized oxide, a grown or deposited oxide, a deposited nitride, an oxidized nitride, etc. The barrier layer 104 is deposited having a thickness in the range of approximately 5–50 Å. The barrier layer 104 serves as an etch stop layer during the removal of the conductive layer, and provides a high quality interface between the substrate 100 and the subsequent oxidized layer (described infra).

A cladding or conductive layer 106, such as a thin insitu doped poly-silicon, amorphous silicon, intrinsic poly-silicon, or other similarly used material, is deposited over the barrier layer 104. The conductive layer 106 is deposited, using LPCVD techniques, or other similarly used processes, at a thickness in the range of approximately 100–500 Å.

Figure 10:
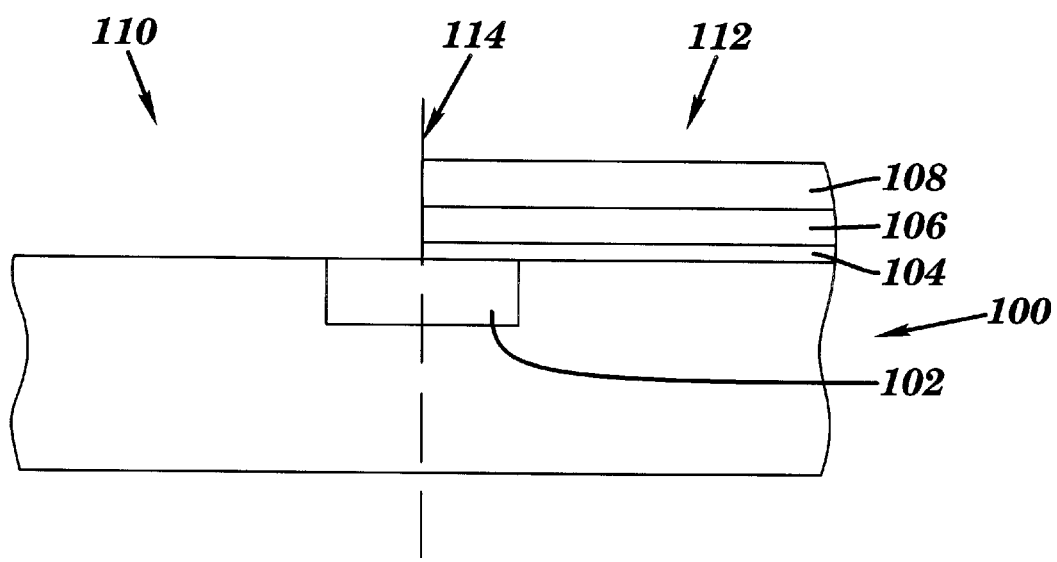
FIG. 10 depicts the transistor of FIG. 9 having a mask thereon.

As illustrated in FIG. 10, a photo resist mask 108 is deposited and patterned over the substrate 100. The mask 108 exposes a first region 110 of the substrate 100 and covers a second region 112 of the substrate 100, wherein a dotted line 114 indicates the separation between the first and second regions 110, 112. Thereafter, the conductive layer 106 and the barrier layer 104 covering the substrate 100 within the first region 110 are removed, for example, using conventional patterning and etching techniques, to expose the surface of the substrate 100.

Figure 11:
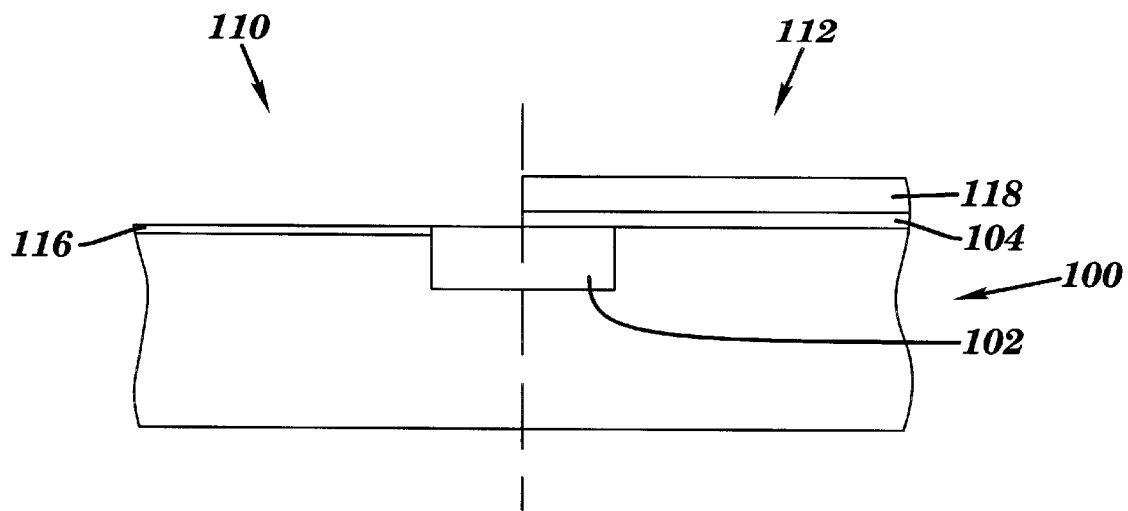
FIG. 11 depicts the transistor of FIG. 10 having a thin and thick dielectric layer formed thereon.

The photo resist mask 108 is then removed from the substrate 100, and a conventional oxidation process begins simultaneously within both regions 110, 112. In particular, as shown in FIG. 11, a portion of the substrate 100 is oxidized in the first region 110, forming a first thin dielectric or gate oxide layer 116. Similarly, the conductive layer 106 within the second region 112 is totally consumed during the oxidation process, forming a second thick dielectric or gate oxide layer 118. The barrier layer 104 beneath the second dielectric layer 118 prevents "oxidation enhanced diffusion," (OED) a phenomenon wherein dopant in the conductive material 106 diffuses into the substrate 100, and dopant diffusion in the substrate 100 is enhanced.

The second dielectric layer 118 is thicker than the first dielectric layer 116 because the oxidation rate within the material of the conductive layer 106, for instance, the poly-silicon, has a substantially greater oxidation growth rate than that of the single crystal silicon material of the substrate 100. In particular, the ratio of growth rates is approximately 4:1 or 5:1 between these two materials.

Figure 12:
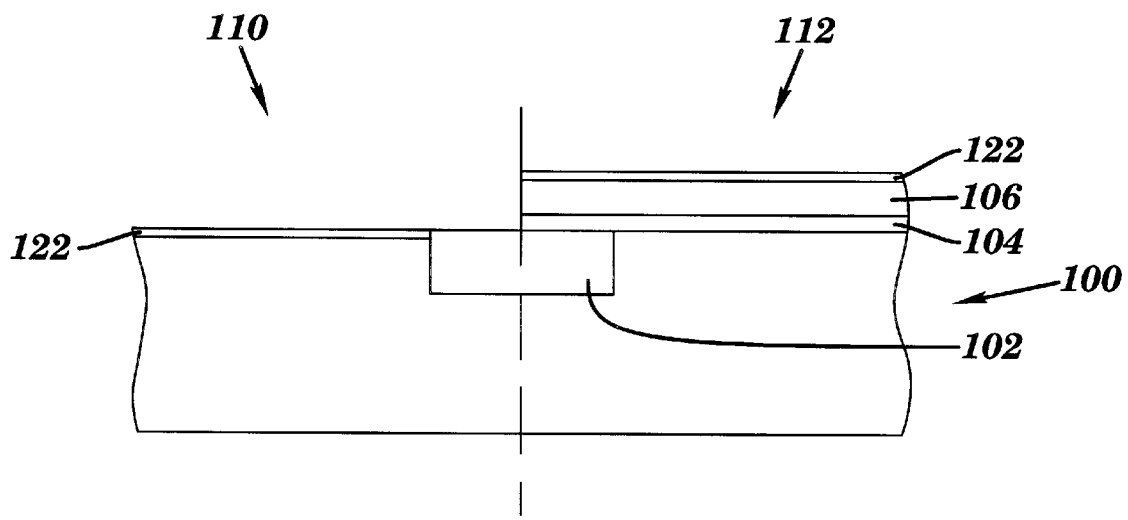
FIG. 12 depicts the transistor of FIG. 10 having a sacrificial oxide layer formed thereon in accordance with a third embodiment.

Alternatively, in accordance with a third embodiment of the present invention, following the removal of the photo resist mask 108 in FIG. 10 from the second region 112, a thin layer of sacrificial oxide 122 may be grown over both regions 110, 112 of the substrate 100 (FIG. 12). For instance, the sacrificial oxide 122 may be formed by oxidizing both regions 110, 112 using a rapid thermal oxidation (RTO) process, at 800–1000° C. for approximately 120 seconds. The sacrificial oxide 122 is then removed from both regions 110, 112, using known techniques. The sacrificial oxide 122 preconditions the surface of both regions 110, 112, prior to forming the final dielectric layers 116, 118 in accordance with the second embodiment, shown in FIG. 11.

Figure 13:
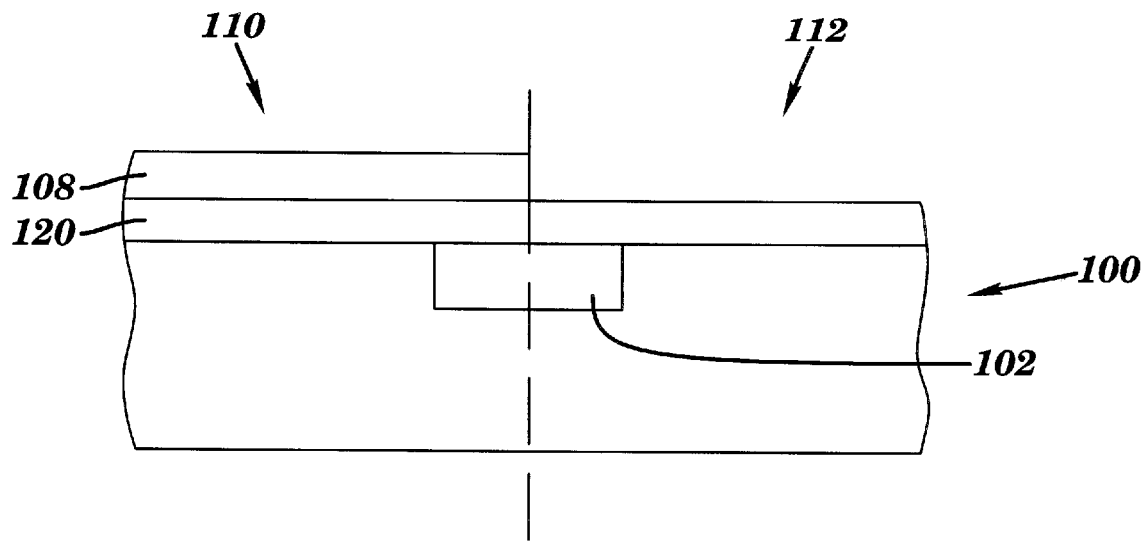
FIG. 13 depicts a transistor having a hard mask and a photo resist mask thereon in accordance with a fourth embodiment of the present invention.
Figure 14:
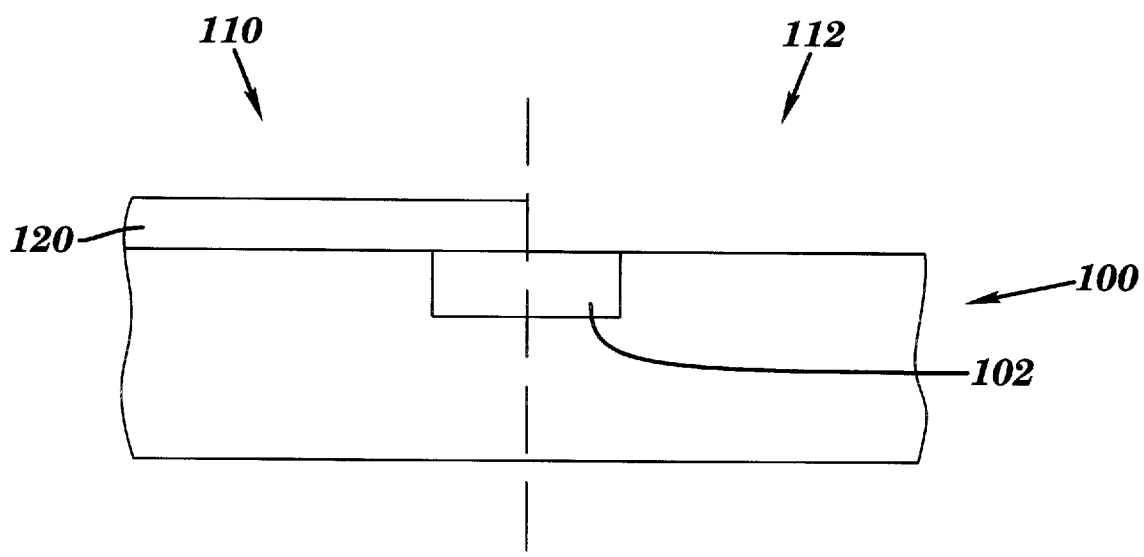
FIG. 14 depicts the transistor of FIG. 13 following patterning and etching of the hard mask.

In accordance with a fourth embodiment, prior to depositing a blanket coating of the barrier layer 104, a hard mask 120 may be deposited over the substrate 100, as illustrated in FIG. 13. The hard mask 120 comprises silicon nitride or other similarly used material. Thereafter, the photo resist mask 108 is deposited over the hard mask 120. The hard mask 120 is then patterned and etched using known techniques, and the photo resist mask 108 is removed, such that the hard mask 120 covers the first region 110 of the substrate 100 and exposes the second region 112 of the substrate 100, as illustrated in FIG. 14.

Figure 15:
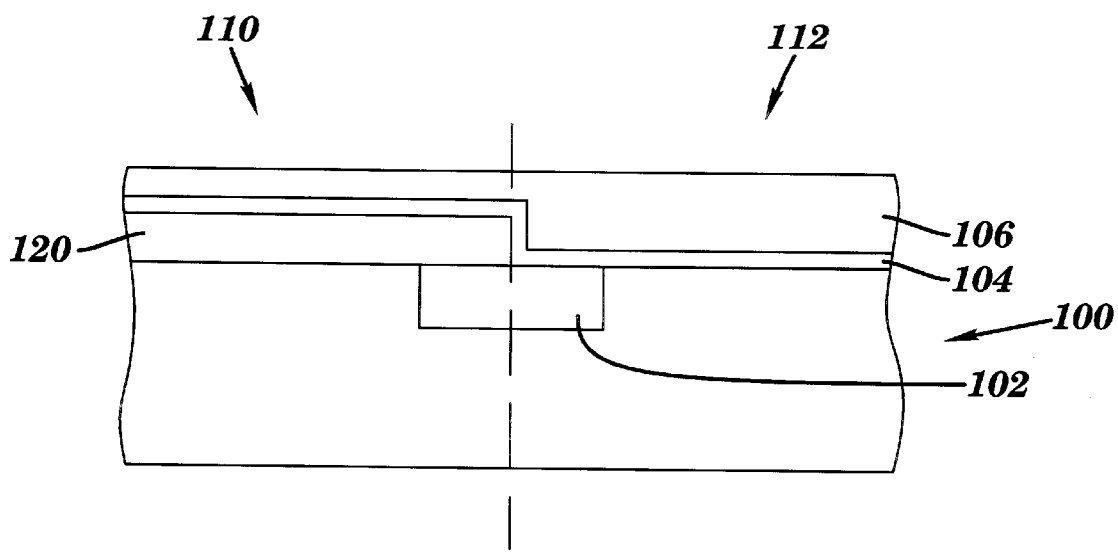
FIG. 15 depicts the transistor of FIG. 14 having a barrier layer and a conductive layer thereon.
Figure 16:
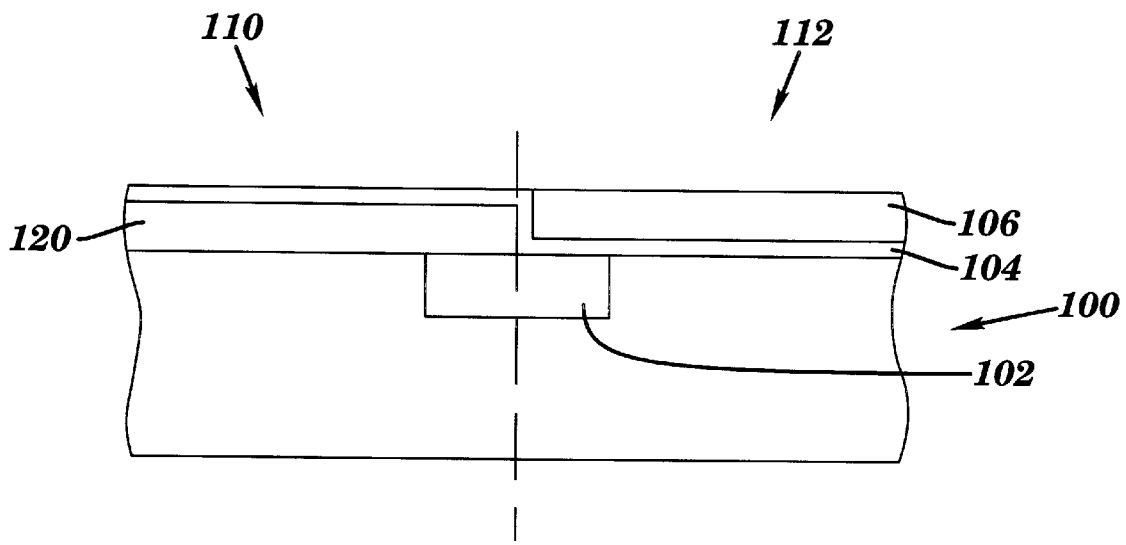
FIG. 16 depicts the transistor of FIG. 15 following planarization.
Figure 17:
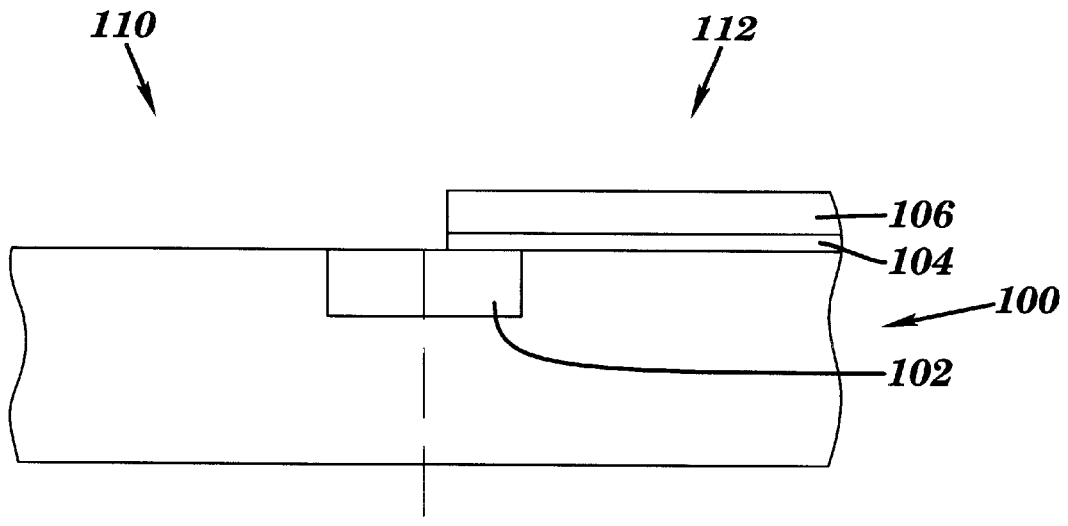
FIG. 17 depicts the transistor of FIG. 16 following removal of the hard mask.

Thereafter, the barrier layer 104 and the conductive layer 106 are conformally deposited over the surface of the substrate 100 and the hard mask 120, as described above and illustrated in FIG. 15. The conductive layer 106 is planarized down to the barrier layer 104, using a CMP, or other similar process (FIG. 16). The exposed barrier layer 104 and hard mask 120 in the first region 110 are then removed, as shown in FIG. 17. Thereafter, the oxidation process begins as described above, resulting in the structure shown in FIG. 11.

As described in the third embodiment, following the removal of the hard mask 120 (FIG. 17), a sacrificial oxide layer 122 may be formed over both regions 110, 112 (FIG. 12). The sacrificial oxide layer 122 is stripped, as described above. Thereafter, both regions 110, 112, are oxidized to form the dielectric layers 116, 118 illustrated in FIG. 11.

Figure 18:
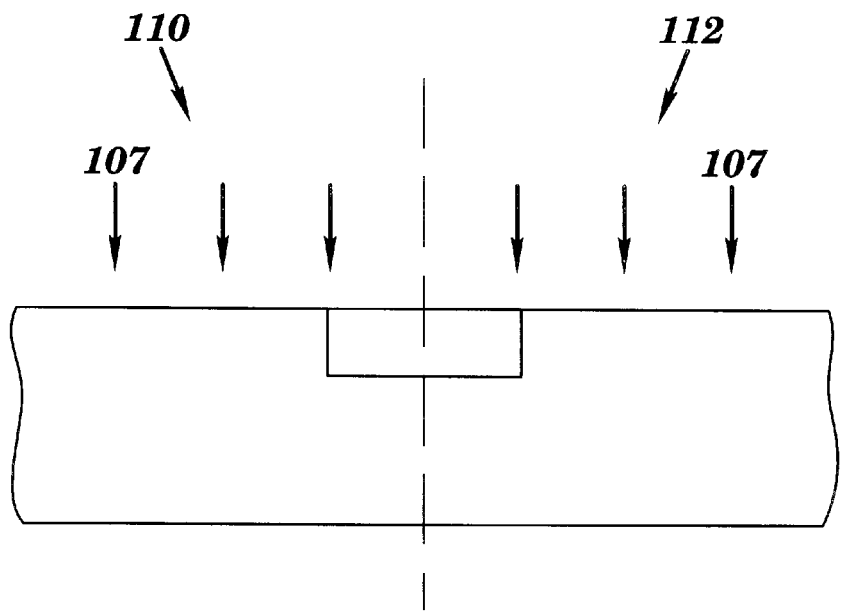
FIG. 18 depicts a transistor having dielectric material implanted therein in accordance with a fifth embodiment of the present invention.
Figure 19:
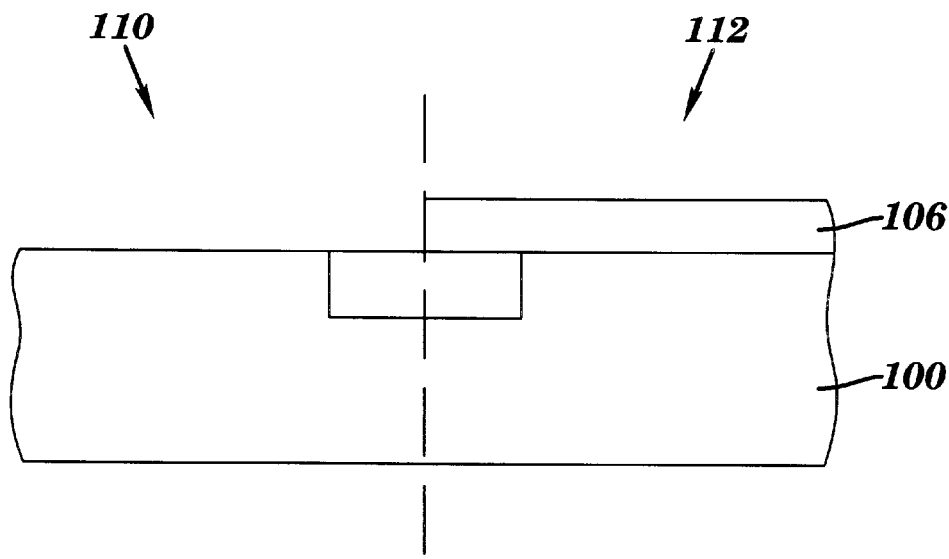
FIG. 19 depicts the transistor of FIG. 18 having a conductive layer thereon.
Figure 20:
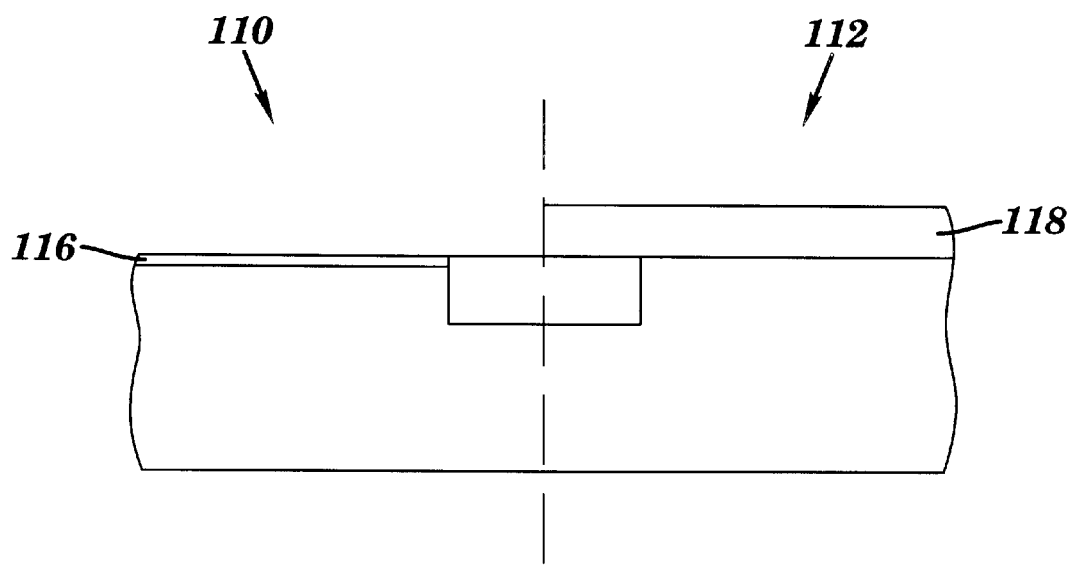
FIG. 20 depicts the transistor of FIG. 19 having a thin and a thick dielectric layer formed thereon.

Alternatively, the structure may be formed according to the second, third and fourth embodiments without depositing a barrier layer 104. Therefore, in accordance with a fifth embodiment, a dielectric material 107, such as nitrogen, may be pre-implanted into both the first and the second regions 110, 112 of the substrate 100 (FIG. 18). Thereafter, the conductive layer 106 is formed over the second region 112, (FIG. 19), using either the photo resist mask 108 or the hard mask 120 techniques described above. The oxidation process is performed simultaneously in both regions 110, 112 to form the first and second dielectric layers 116, 118, respectively, as shown in FIG. 20.

The pre-implantation serves the dual purpose of reducing the oxidation rate of the substrate 100 material in the first region 110, and hindering the diffusion of dopant from the conductive layer 106 material into the substrate 100 in the second region 112. As a result, the difference in thickness of the oxidized dielectric between the first region 110 and the second region 112 would be further enhanced or exaggerated.

Figure 21:
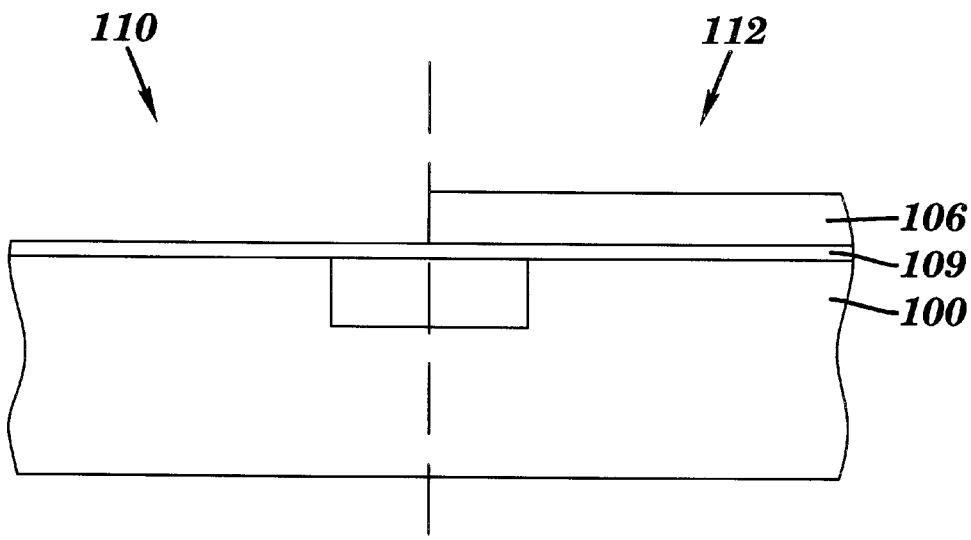
FIG. 21 depicts a transistor having dielectric layer deposited thereon in accordance with a sixth embodiment of the present invention.

In accordance with a sixth embodiment, a thin layer of dielectric material 109 may be formed over the entire surface of the substrate 100 (FIG. 21). For example, nitridized oxide may be grown on the surface of the substrate 100, or a thin nitride layer, having a thickness of approximately 1–20 Å, may be deposited over the substrate 100, using known techniques. Thereafter, the conductive layer 106 is formed over the second region 112 of the substrate 100 using either the photo resist mask 108 or hard mask 120 techniques. The oxidation process is performed simultaneously in both regions 110, 112 to form the first and second dielectric layers 116, 118, respectively, as shown in FIG. 20. The thin layer of dielectric material 109 functions in a similar manner as that of the pre-implantation of dielectric material 107.

Figure 22:
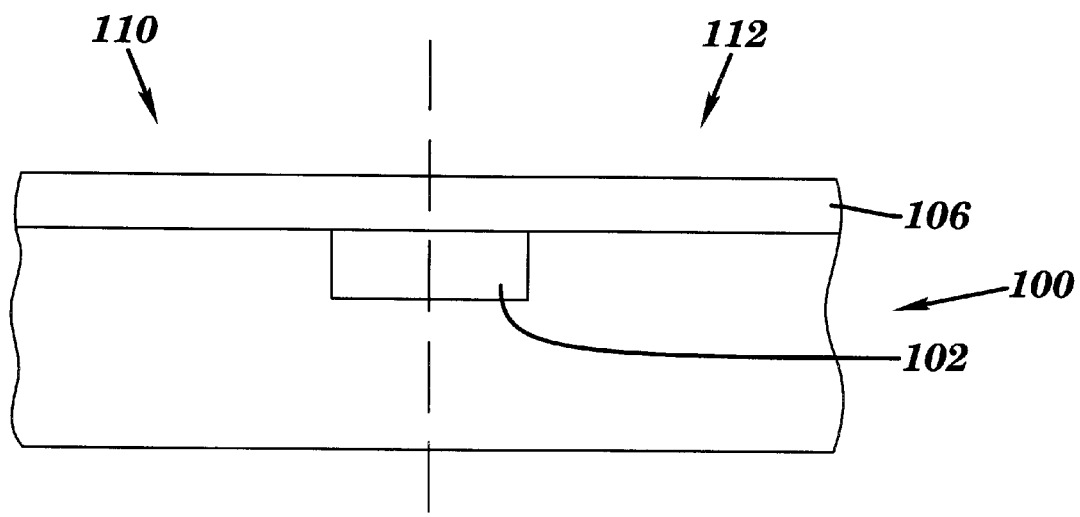
FIG. 22 depicts a transistor having a conductive layer thereon in accordance with a seventh embodiment of the present invention.
Figure 23:
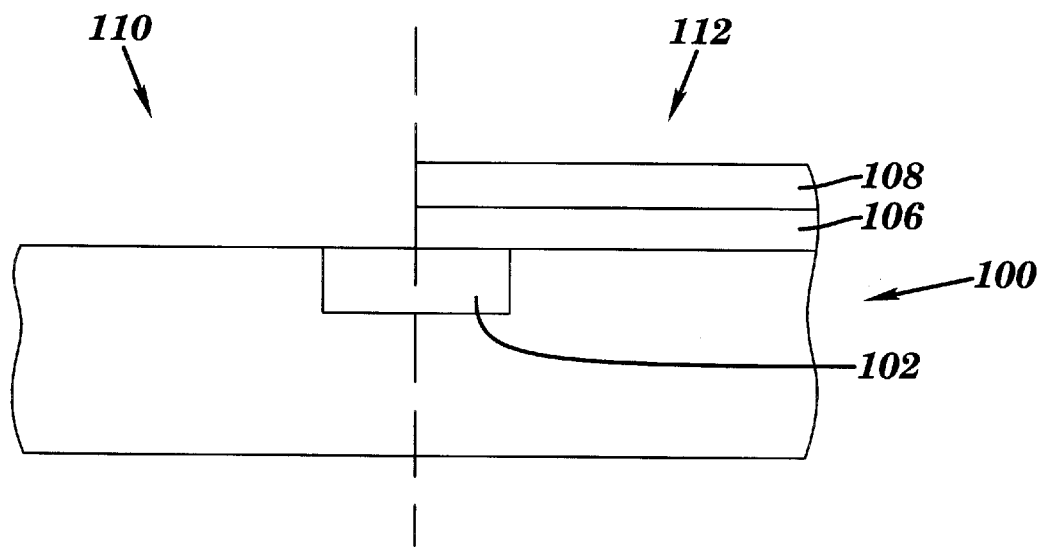
FIG. 23 depicts the transistor of FIG. 22 having a photo resist mask thereon.
Figure 24:
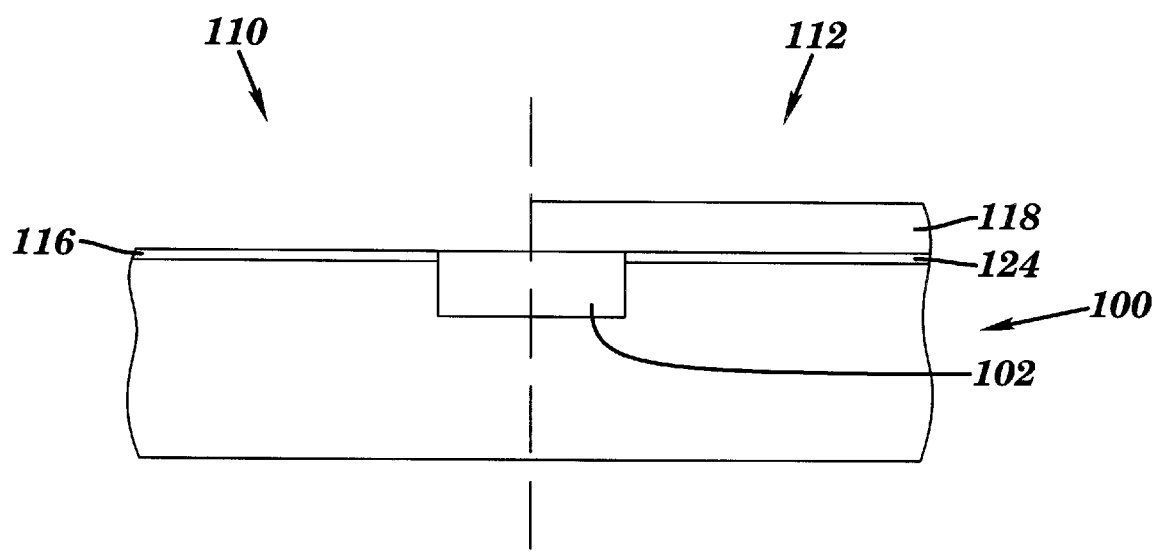
FIG. 24 depicts the transistor of FIG. 23 having a thin and thick dielectric layer, and an oxidation enhanced diffusion region formed therein.

In accordance with a seventh embodiment of the present invention, a device may be formed without the use of the barrier layer 104, pre-implantation of the dielectric material 107, or the thin layer of dielectric material 109. As illustrated in FIG. 22, the conductive layer 106 is deposited over the surface of the substrate 100 as described above. The photo resist mask 108 is placed over the substrate 100, such that the first region 110 is exposed and the second region 112 is covered. The conductive layer 106 in the first region 110 is removed, as illustrated in FIG. 23. Thereafter, both regions 110, 112 are oxidized as described above. In this instance, however, not only are the dielectric layers 116, 118 formed, but as illustrated in FIG. 24, an additional OED region 124, or oxidation enhanced diffusion region, forms beneath the dielectric layer 118 in the second region 112. In other words, because the barrier layer 104, or other dielectric material 107, 109, is not deposited between the substrate 100 and the conductive layer 106, dopant from the conductive layer 106 and/or a portion of the conductive layer 106 diffuses into the substrate 100 during the oxidation processing, and diffusion of the dopant in the substrate 100 is enhanced.

Figure 25:
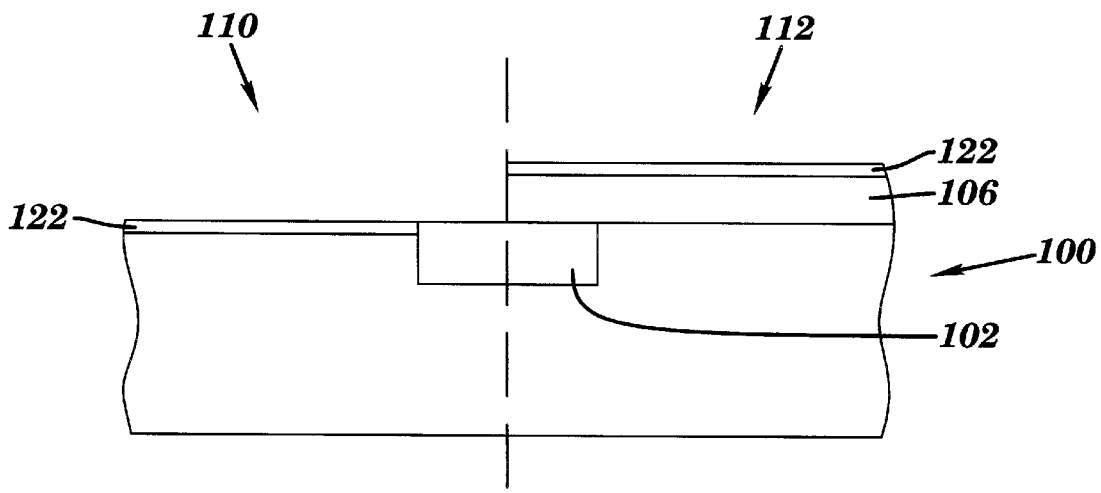
FIG. 25 depicts the transistor of FIG. 23 having a sacrificial oxide layer thereon.

As described in the third embodiment above, the sacrificial oxide layer 122 may be formed over both regions 110, 112 following the removal of the photo resist mask 108 (FIG. 25). The sacrificial oxide layer 122 is stripped, as described above. Thereafter, both regions 110, 112, are oxidized to form the dielectric layers 116, 118, and the OED region 124, illustrated in FIG. 24.

Figure 26:
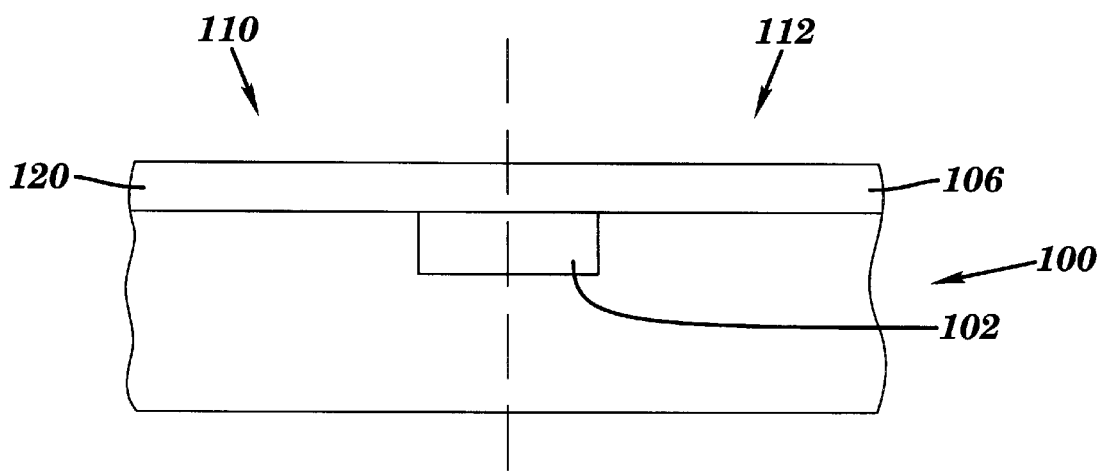
FIG. 26 depicts a transistor in accordance with an eighth embodiment of the present invention.

In a similar manner to that of the fourth embodiment, and in accordance with an eighth embodiment, the hard mask 120 may be deposited over the substrate 100. The photo resist mask 108 is placed over the hard mask 120 (FIG. 13), and the hard mask 120 is patterned and etched such that the first region 110 is covered and the second region 112 is exposed, (FIG. 14). The conductive layer 106 is then deposited over the surface of the hard mask 120 and the substrate 100, and planarized using a CMP process, leaving the structure illustrated in FIG. 26. Thereafter, the hard mask 120 is removed, and the first and second regions 110, 112 are oxidized to form dielectric layers 116, 118, and OED region 124 (FIG. 24).

As described above in third embodiment, a sacrificial oxide layer 122 may be formed over both regions 110, 112 following the removal of the hard mask 120 (FIG. 25). The sacrificial oxide layer 122 is stripped, as described above. Thereafter, both regions 110, 112, are oxidized to form the dielectric layers 116, 118, and the OED region 124 illustrated in FIG. 24.

Figure 27:
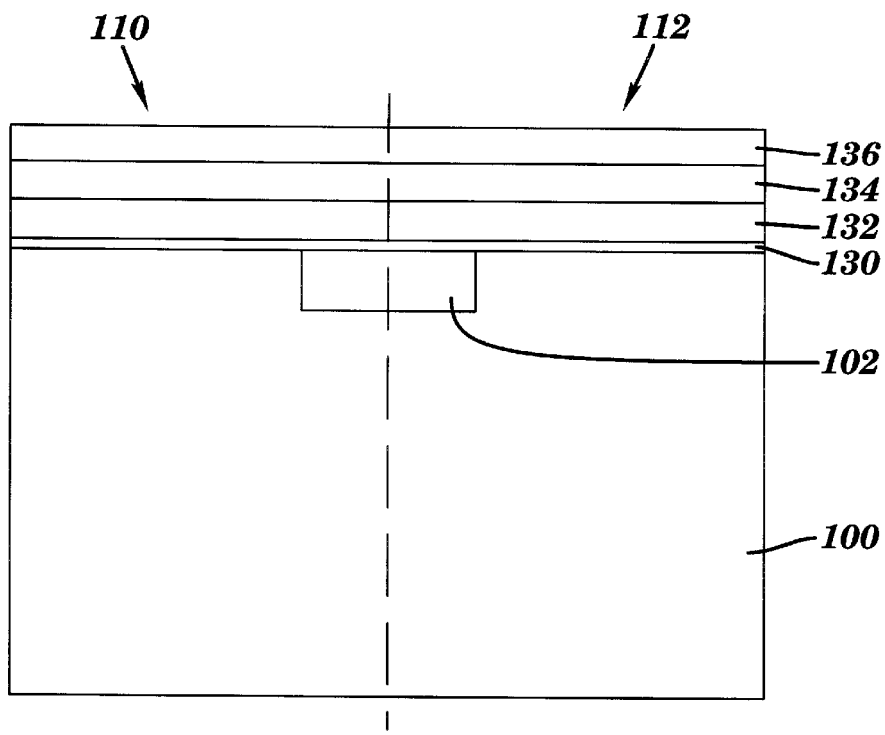
FIG. 27 depicts a substrate in accordance with a ninth embodiment of the present invention.

In accordance with a ninth embodiment, FIG. 27 shows the substrate 100 having the STI 102 formed therein. A pad oxide layer 130 is formed or thermally grown over the surface of the substrate 100. The pad oxide layer 130 comprises a thermally grown oxide, or a deposited oxide material, having a thickness of approximately 25–75 Å. A pad nitride layer 132 is deposited, using conventional techniques, over the pad oxide layer 130, having a thickness of approximately 300–1000 Å. A pad TEOS (tetraethylorthosilicate) layer 134 is deposited over the pad nitride layer 132, having a thickness of approximately two times the thickness of the pad nitride layer 132, e.g., approximately 600–2000 Å. Thereafter, a layer of photo resist 136 is deposited, using conventional techniques, over the pad TEOS layer 134, having a thickness of approximate to the thickness of the pad oxide layer 130, the pad nitride layer 132 and the pad TEOS layer 134, e.g., approximately 1000–4000 Å.

Figure 28:
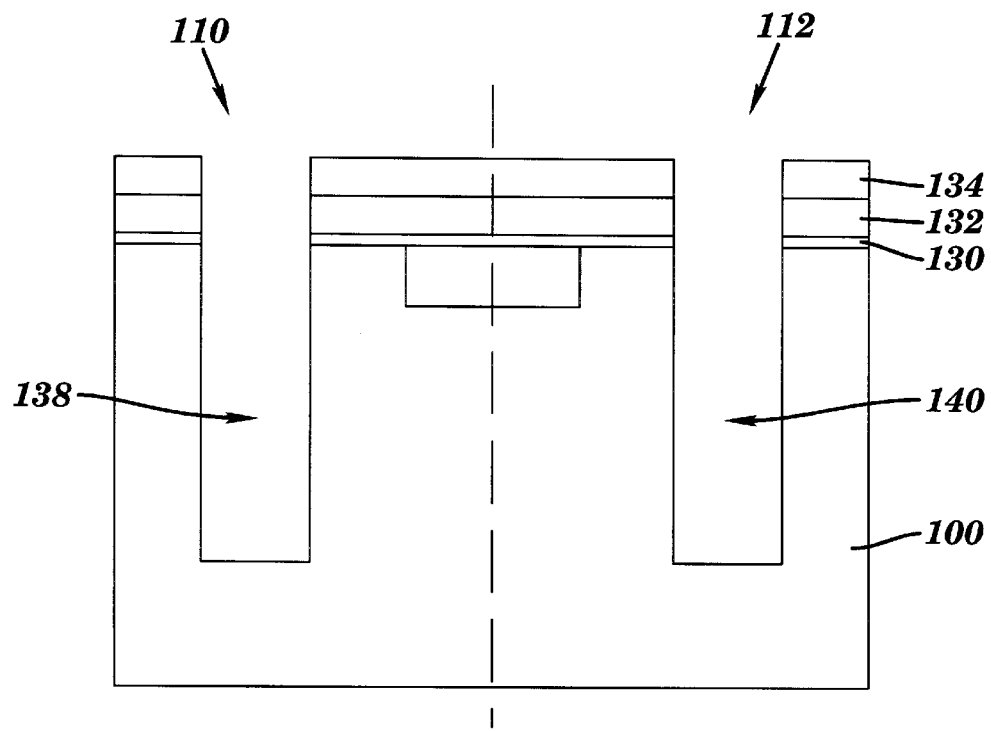
FIG. 28 depicts the substrate of FIG. 27 having trenches formed therein.

The layer of photo resist 136 is then exposed, using conventional masking techniques. The pad oxide layer 130, the pad nitride layer 132, the pad TEOS layer 134, and the substrate 100 are etched to form a first trench 138 and a second trench 140 within the substrate 100. Unlike the first embodiment, the first and second trenches may be formed having dimensions that are substantially similar. Thereafter, the layer of photo resist 136 is removed using conventional techniques, as illustrated in FIG. 28.

Figure 29:
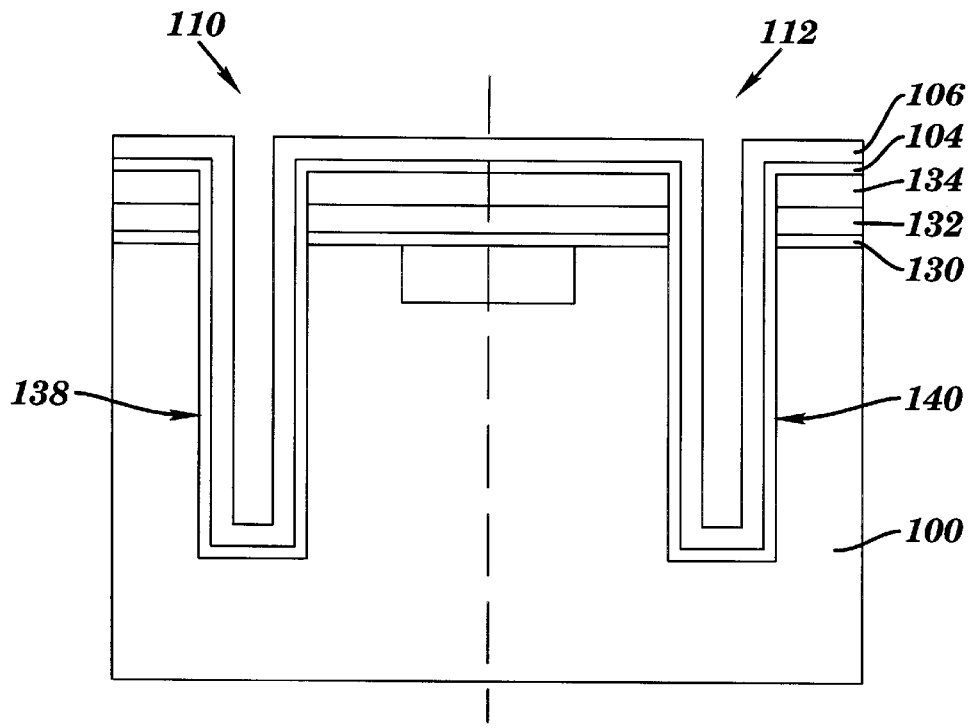
FIG. 29 depicts the substrate of FIG. 28 having a barrier layer and conductive layer thereon.
Figure 30:
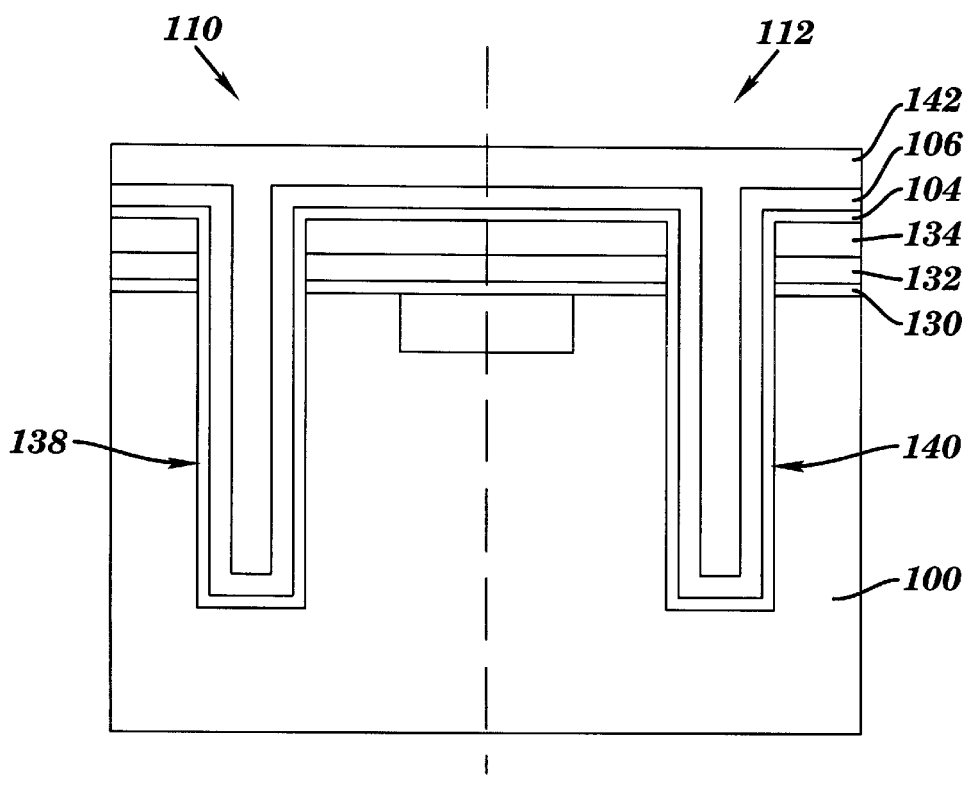
FIG. 30 depicts the substrate of FIG. 29 having a photo resist layer thereon.

As illustrated in FIG. 29, the barrier layer 104 is conformally deposited over the surface of the substrate 100 and within the trenches 138, 140. Thereafter, the conductive layer 106 is deposited over the surface of the substrate 100 and within the trenches 138, 140. A second layer of photo resist 142 is deposited over the surface of the substrate 100, filling the trenches 138, 140 (FIG. 30).

Figure 31:
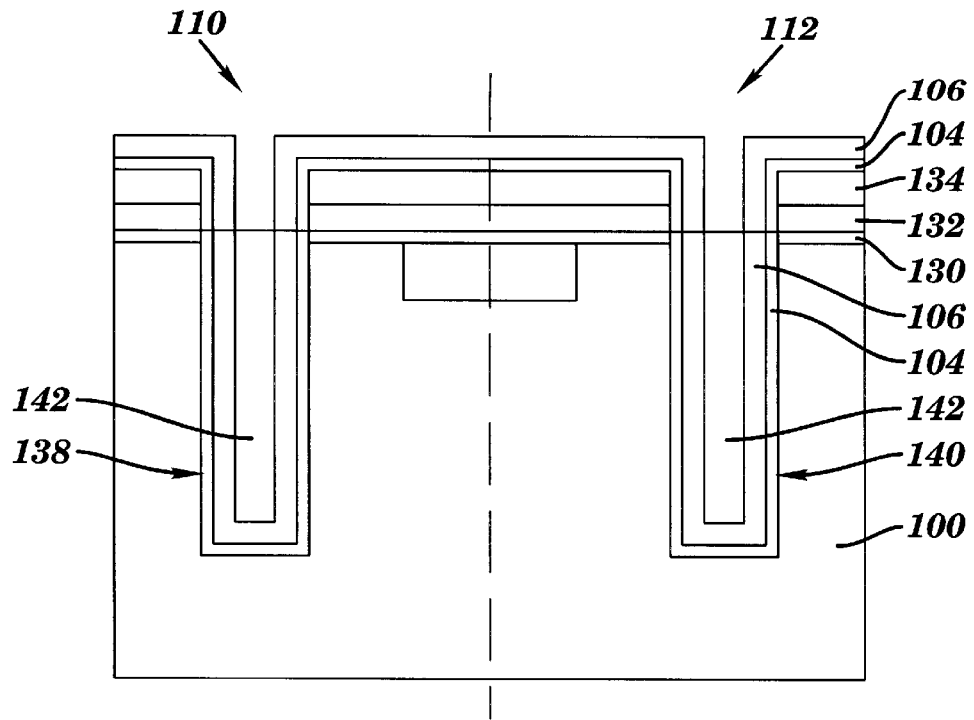
FIG. 31 depicts the substrate of FIG. 30 after etching.
Figure 32:
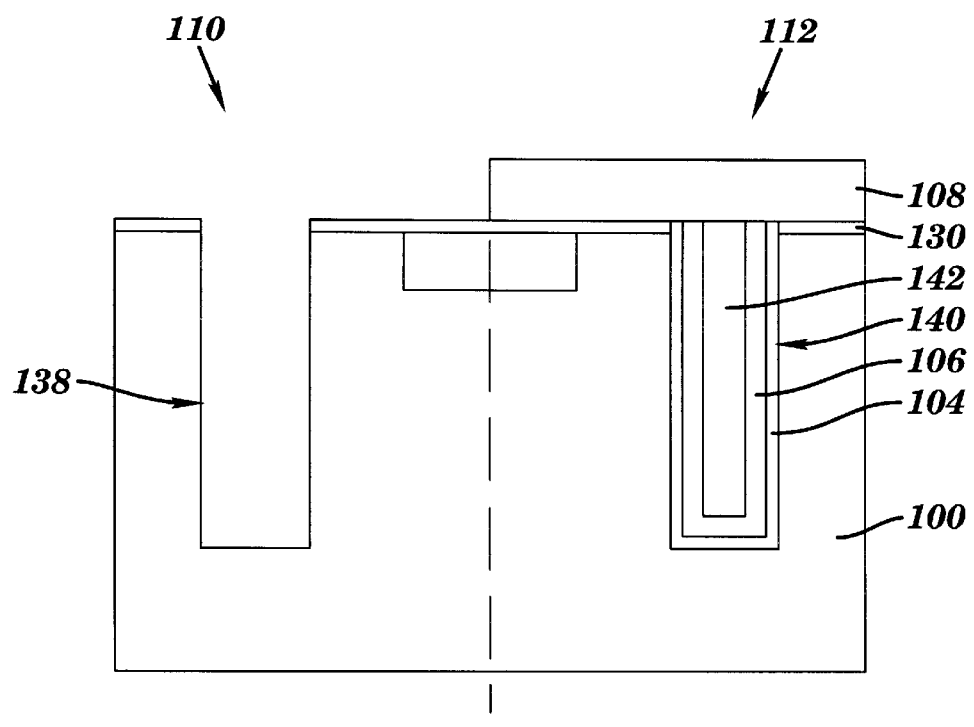
FIG. 32 depicts the substrate of FIG. 31 having a photo resist mask thereon.

Using an O₂ plasma etch, or other similar process, the layer of photo resist 142 is etched down to approximately the depth of the pad oxide layer 130, as illustrated in FIG. 31. Thereafter, the conductive layer 106, the barrier layer 104, the pad TEOS layer 134 and the pad nitride layer 132 are removed from the surface of the substrate 100 down to the pad oxide layer 130. A photo resist mask 108 is patterned over the substrate 100, wherein the first region 110 is exposed and the second region 112 is covered (FIG. 32). The conductive layer 106 and the barrier layer 104 within the first trench 138 are removed using a conventional etching process.

Figure 33:
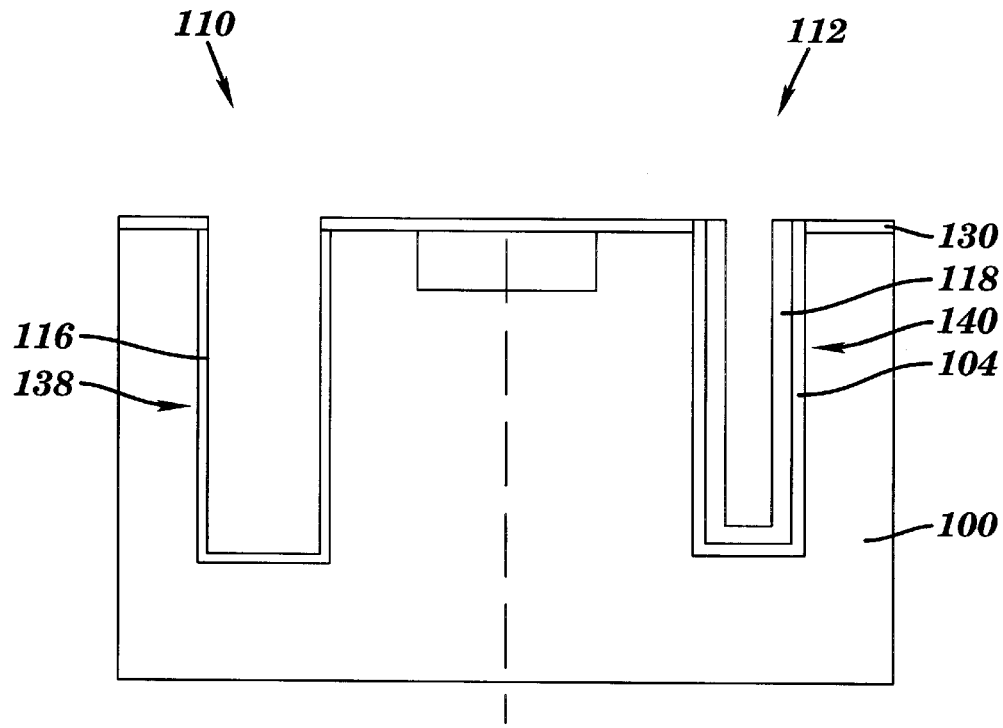
FIG. 33 depicts the substrate of FIG. 33 following oxidation.

The photo resist mask 108 is then removed, and the layer of photo resist 142 remaining in the second trench 140 is removed using a conventional etch process. The first and second regions 110, 112 are simultaneously oxidized, as described above, to form a thin dielectric layer 116 within the first trench 138 and a thick dielectric layer 118 within the second trench 140, as illustrated in FIG. 33.

Figure 34:
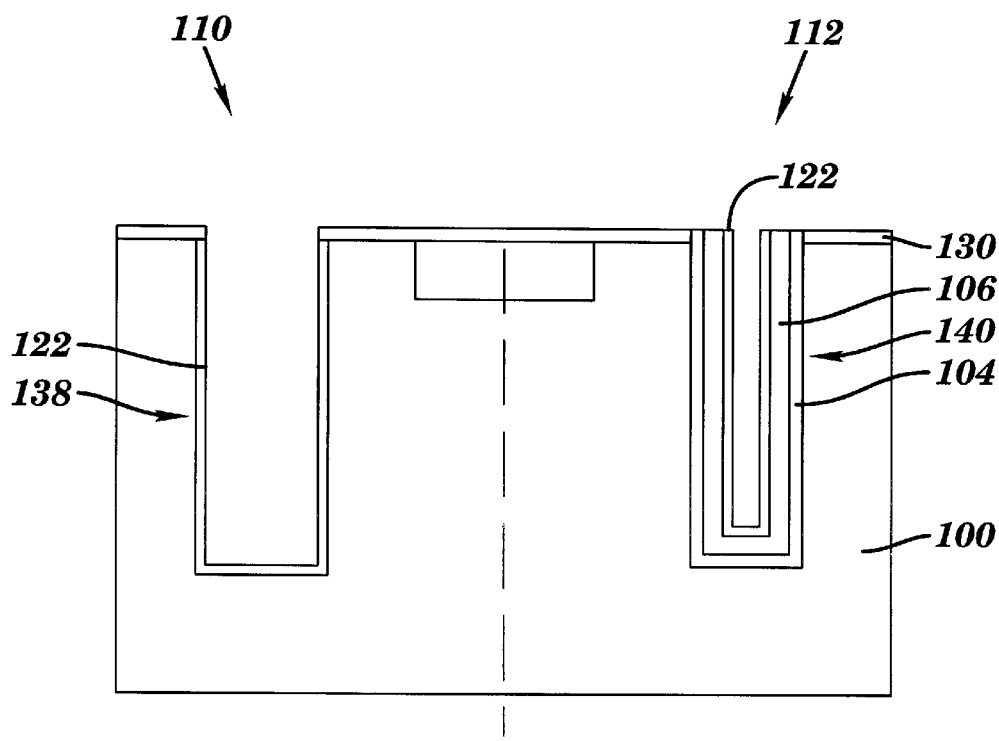
FIG. 34 depicts the substrate of FIG. 32 having a sacrificial oxide layer thereon.

As illustrated in FIG. 34, and described in the third embodiment, following the removal of the photo resist mask 108 and the photo resist layer 142 within the second trench 140 (FIG. 32), a sacrificial oxide layer 122 may be formed within the trenches 138, 140 of both regions 110, 112 (FIG. 34). The sacrificial oxide layer 122 is then stripped, as described above. Thereafter, both regions 110, 112, are oxidized to form the dielectric layers 116, 118 illustrated in FIG. 33.

Figure 35:
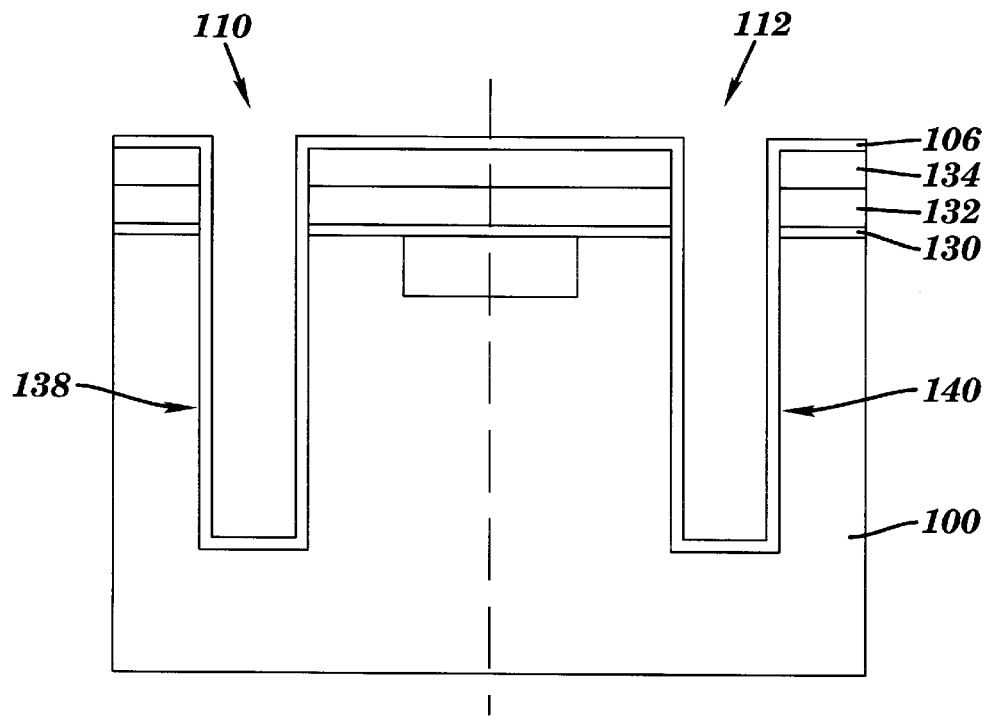
FIG. 35 depicts the substrate of FIG. 28 having a conductive layer thereon in accordance with a tenth embodiment of the present invention.
Figure 36:
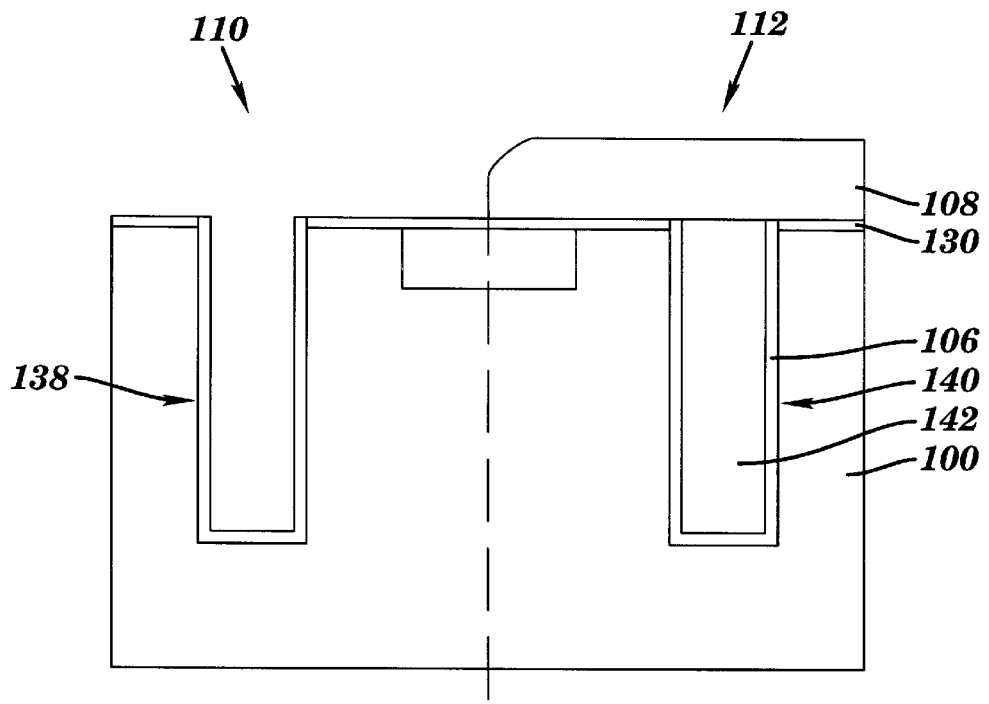
FIG. 36 depicts the substrate of FIG. 35 having a photo resist mask thereon.
Figure 37:
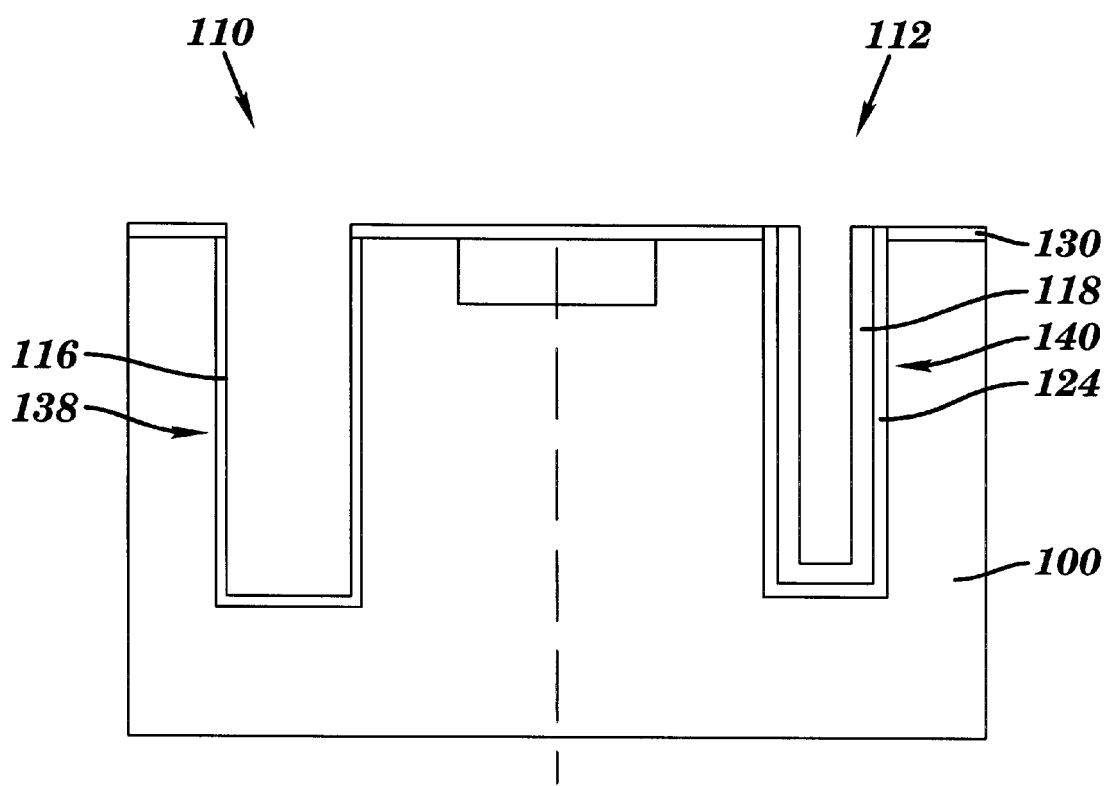
FIG. 37 depicts the substrate of FIG. 36 following oxidation.

In accordance with a tenth embodiment, the conductive layer 106 may be deposited within the trenches (FIG. 35) following formation of the first and second trenches 138, 140 (FIG. 28), rather than depositing the barrier layer 104. Thereafter, the layer of photo resist 142 is deposited, and the conductive layer 106, the pad TEOS layer 134 and the pad nitride layer 132 are etched down to the pad oxide layer 130 (FIG. 36). The photo resist mask 108 is placed over the substrate 100 covering the second region 112, and the photo resist layer 142 within the first trench 138 is removed. Thereafter, both regions 110, 112 are simultaneously oxidized to form the thin dielectric layer 116, the thick dielectric layer 118 and the OED region 124 (FIG. 37).

Similar to the description above, the dielectric material 107, such as nitrogen, may be pre-implanted into both the first and the second regions 110, 112 of the substrate 100 prior to depositing the conductive layer 106. Also, the thin layer of dielectric material 109 may be formed over the entire surface of the substrate 100 prior to depositing the conductive layer 106.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

We claim:

1. A method of forming first and second electronic devices comprising:

forming a first trench capacitor in a substrate, having a first surface dimension;

forming a second trench capacitor in said substrate, having a second surface dimension, wherein the second surface dimension is greater than the first surface dimension;

depositing a first dielectric having the first dielectric thickness within at least the first trench;

depositing a first material within the first and second trenches, wherein the first material substantially fills the first trench, and at least partially fills the second trench;

removing the first material from the second trench;

forming a second dielectric having the second dielectric thickness within the second trench; and depositing a second material within the second trench.

2. The method of claim 1, wherein the substrate comprises a semiconductor wafer.

3. The method of claim 1, wherein the first and second materials are a material selected from the group consisting of: amorphous silicon and polysilicon.

4. The method of claim 1, wherein removing the first material from the second trench comprises isotropically etching the first material within the second trench.

5. A method of forming first and second capacitors on a substrate, comprising the steps of:

etching first and second trenches in the substrate through a single mask;

forming a first capacitor in a first trench disposed in a first region of the substrate, said first capacitor having a given breakdown voltage and a first node dielectric; and forming a second capacitor in a second trench disposed in a second region of the substrate, said second capacitor having a breakdown voltage greater than said first capacitor and a second node dielectric different from said first node dielectric.

6. The method of claim 5, wherein said step of etching said first and second trenches in said substrate comprises the steps of:

forming a mask layer over the substrate, said mask having a first opening of a first width and a second opening of a width greater than said first width; and etching areas of the substrate exposed by the mask to form trenches, wherein a second trench formed in an area of the substrate beneath said second opening has a depth greater than a first trench formed in an area of the substrate beneath said first opening.

7. The method of claim 6, wherein a first capacitor is formed in said first trench and a second capacitor is formed in said second trench, said second capacitor having less capacitance per unit area than said first capacitor and having a greater total capacitance area than said first capacitor.

8. The method of claim 5, wherein an array capacitor is formed in said first trench and a decoupling capacitor is formed in said second trench.

9. The method of claim 5, wherein said first node dielectric is thinner than said second node dielectric.

* * * * *